United States Patent [19]
Montoye et al.

[11] Patent Number: 5,570,036
[45] Date of Patent: Oct. 29, 1996

[54] CMOS BUFFER CIRCUIT HAVING POWER-DOWN FEATURE

[75] Inventors: Robert K. Montoye, Los Gatos; John J. Zasio, Sunnyvale, both of Calif.

[73] Assignee: HAL Computer Systems, Inc., Campbell, Calif.

[21] Appl. No.: 519,444

[22] Filed: Aug. 25, 1995

[51] Int. Cl.$^6$ ...................................................... H03K 19/20
[52] U.S. Cl. ........................... 326/16; 326/112; 324/158 R
[58] Field of Search ............................ 326/16, 106, 112; 324/522, 523

[56] References Cited

U.S. PATENT DOCUMENTS

| | | | |
|---|---|---|---|
| 5,097,206 | 3/1992 | Perner | 324/158 R |
| 5,285,119 | 2/1994 | Takahashi | 326/16 |
| 5,321,354 | 6/1994 | Ooshima | 324/158 R |
| 5,467,026 | 11/1995 | Arnold | 326/16 |
| 5,469,076 | 11/1995 | Badyal | 326/16 |

FOREIGN PATENT DOCUMENTS 1283844  11/1989  Japan ........................................ 326/16

*Primary Examiner*—Edward P. Westin
*Assistant Examiner*—Andrew Sanders
*Attorney, Agent, or Firm*—Skjerven, Morrill, MacPherson, Franklin & Friel; William L. Paradice, III

[57] ABSTRACT

The gate of a P-channel pull-up transistor connected between an input node and a supply voltage in a buffer circuit is coupled to a test node. An N-channel pull-down transistor is connected between the input node and ground and has a gate connected to the test node. A logic low signal provided to the test node allows the circuit to operate normally. During test mode, a logic high signal is provided to the test node to turn off the P-channel pull-up transistor and thus prevent DC current flow in the circuit via the pull-up transistor. This logic high signal also turns on the pull-down transistor and, by shorting the input node to ground potential, prevents any other DC crossover currents from flowing in the circuit. Thus, during test mode, quiescent current flow resulting from small manufacturing defects in the circuit are obscured by larger DC currents and, as a result, may be readily measured to detect the presence of such small manufacturing defects.

5 Claims, 1 Drawing Sheet

CMOS BUFFER CIRCUIT HAVING POWER-DOWN FEATURE

CROSS REFERENCES TO RELATED APPLICATIONS

This application is related to commonly owned U.S. patent application entitled "CMOS BUFFER CIRCUIT HAVING INCREASED SPEED" filed on Aug. 25, 1995, Ser. No. 08/519,443, incorporated herein by reference.

FIELD OF THE INVENTION

The present invention relates to buffer circuits and specifically relates to a high speed CMOS buffer circuit having a test-enable feature that allows for quiescent current testing of the circuit.

BACKGROUND OF THE INVENTION

One of the most important factors influencing purchasing of integrated circuits is reliability. Thus manufacturers employ various tests to ensure that each IC is defect-free.

One well known and highly dependable method of testing a CMOS IC for defects is to measure the quiescent current flow in the IC resulting from the $V_{DD}$ power supply. This test, which is often referred to as an $I_{DDQ}$ test, is typically implemented by allowing an IC to reach a stable logic state and, while the IC remains in that logic state, measuring the quiescent current flow in the IC. In such a state, a defect-free CMOS IC chip should draw no DC current and should have a leakage current not exceeding approximately 10 µA. On the other hand, an IC having a manufacturing defect as small as a one micron diameter "hot spot" typically exhibits $I_{DDQ}$ current flow on the order of several hundred micro-amps and, in some instances, may be as great as several milli-amps. As such, $I_{DDQ}$ testing accurately detects manufacturing faults which may be difficult to detect through performance evaluation or other functional testing techniques. It has been found that ICs screened by such $I_{DDQ}$ testing have as much as ten times fewer manufacturing defects than do ICs not so screened.

A conventional CMOS logic circuit has complimentary pairs of N-channel and P-channel transistors which allows such a circuit to eliminate, in its quiescent state, DC current flow. For example, an n-input CMOS NOR circuit has each of its logic inputs connected to a gate of an associated one of n N-channel pull-down transistors coupled in parallel between the logic output and ground. Each of these logic inputs is also connected to a gate of an associated one of n P-channel pull-up transistors coupled in series between the logic output and the $V_{DD}$ supply. Although drawing no DC current, which as will be described below is necessary for $I_{DDQ}$ testing, this complimentary nature undesirably slows the speed of logic operations having a large number of inputs. Where it is desired to have, for instance, 16 logic inputs, the required 16 series-connected P-channel pull-up transistors will result in a very long gate delay and, thus, undesirably reduce the speed of the circuit.

It is possible to increase the speed of such circuits having large numbers of logic inputs by replacing the plurality of series-connected P-channel pull-up transistors with a single P-channel pull-up transistor having its gate tied to ground, as illustrated in FIG. 1.

CMOS buffer circuit 10, shown as part of a CMOS OR gate 11, is configured as a sense amplifier. A plurality of input signal lines $A_0$-$A_n$ are coupled to input node A via N-channel MOS pull-down transistors $MN_0$-$MN_n$, respectively. A P-channel MOS weak pull-up transistor $MP_1$ is connected between the voltage supply $V_{DD}$ and input node A. Transistor $MP_1$ has its gate connected to ground potential and thus remains in a conductive state. Capacitor $C_1$ models the capacitive nature of input node A. If all input signals $A_0$-$A_n$ are logic low, current flow through transistor $MP_1$ charges the capacitive load $C_1$ toward $V_{DD}$ and, accordingly, pulls node A high. This logic high signal is inverted by a CMOs inverter 12 and appears as a logic low at output terminal Z. If, on the other hand, one or more of input signals $A_0$-$A_n$ is high, node A will be pulled low and, accordingly, a logic high signal will appear at terminal Z.

Detecting small manufacturing defects in circuit 10 using an $I_{DDQ}$ test may, however, be problematic. The gate of transistor $MP_1$ is connected to ground potential and, thus, transistor $MP_1$ remains on at all times. Accordingly, a high input signal at any one of pull-down transistors $MN_{A_1}$-$MN_{A_n}$ will create a DC current path from $V_{DD}$ to ground through pull-up transistor $MP_1$. It follows that if, in its stable logic state, any one of input signals $A_0$-$A_n$ is high, circuit 10 will conduct DC current. Although this DC current may be on the order of only a few micro-amps for each such circuit 10, ICs containing thousands of such circuits 10 may exhibit a resultant DC current exceeding several Amps. Such a large DC current essentially "drowns out" and renders impossible to detect the significantly smaller current resulting from manufacturing defects and, thus, eliminates the ability to perform $I_{DDQ}$ testing on circuit 10. This inability, in turn, may adversely affect the reliability ratings of circuit 10.

SUMMARY

An improved buffer circuit is disclosed which eliminates DC current flow during its stable state while taking advantage of the faster single pull-up transistor design. In accordance with the present invention, the gate of a pull-up transistor connected between a logic input node and a power supply is connected to a "test" node. A pull-down transistor is connected between the input node and ground and has a gate connected to the test node.

In the preferred embodiment, where the pull-up transistor is a P-channel device and the pull-down transistor is an N-channel device, a logic low signal provided at the test node allows the circuit to operate normally.

During test mode, a logic high signal is provided to the test node to turn off the P-channel pull-up transistor so as to prevent DC current flow therein. This logic high signal also turns on the pull-down transistor and, by shorting the input node to ground potential, prevents the input node voltage from floating. If not so prevented, the input node voltage may drift to a voltage sufficient to simultaneously turn on both the P-channel and N-channel transistors (not shown) within CMOS inverter 12 and, thus, create an undesirable DC current path through inverter 12.

Thus, by eliminating DC current flow in the circuit during test mode, the quiescent current flow resulting from small manufacturing defects in the circuit may be readily detected. Accordingly, $I_{DDQ}$ testing may be performed in an effective manner to detect the presence of such small manufacturing defects.

DETAILED DESCRIPTION

Figure 1:
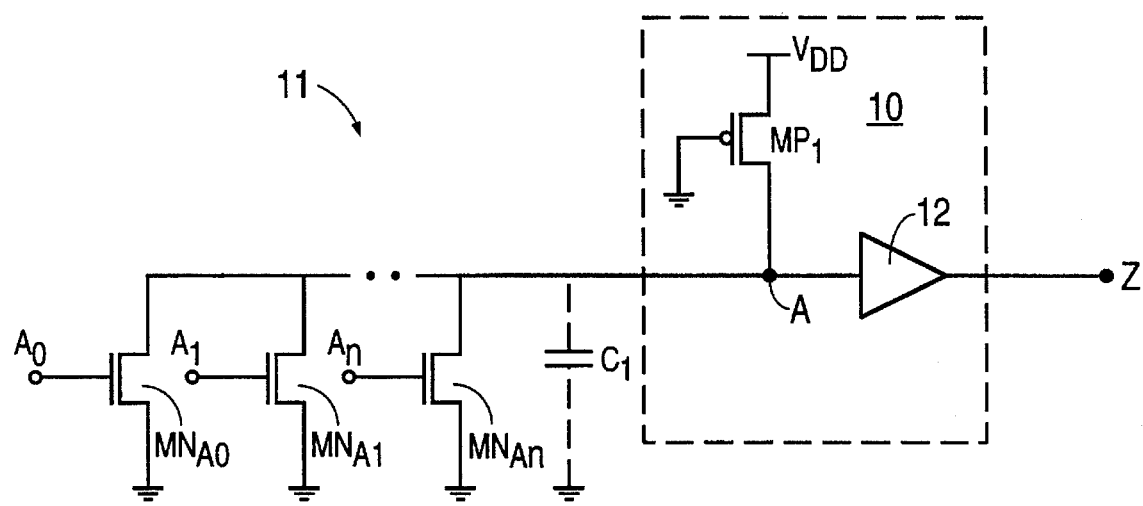
FIG. 1 is a schematic diagram of a conventional buffer circuit shown as part of a CMOS OR gate.
Figure 2:
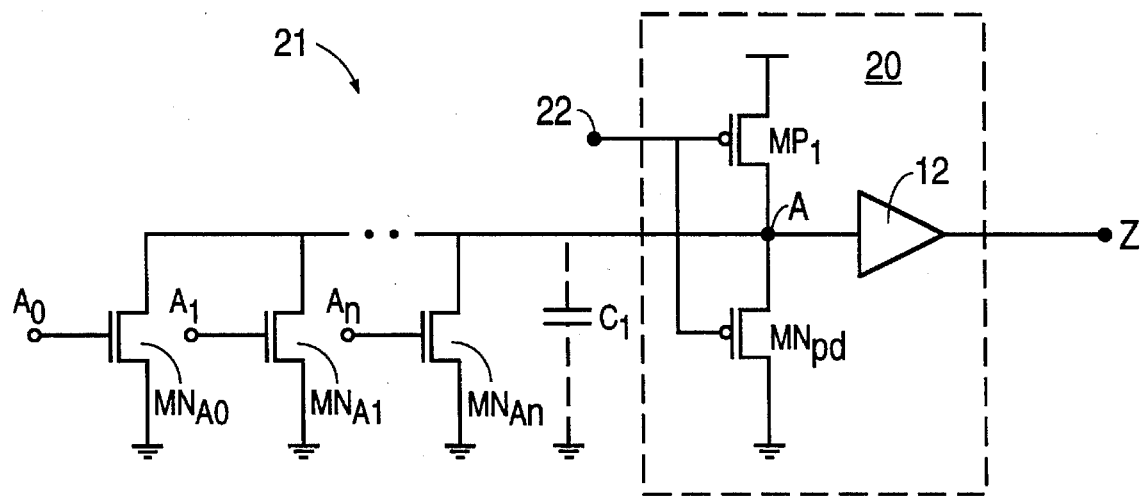
FIG. 2 is a schematic diagram of a buffer circuit, shown as part of a CMOS OR gate, in accordance with the present invention.
Figure 1:
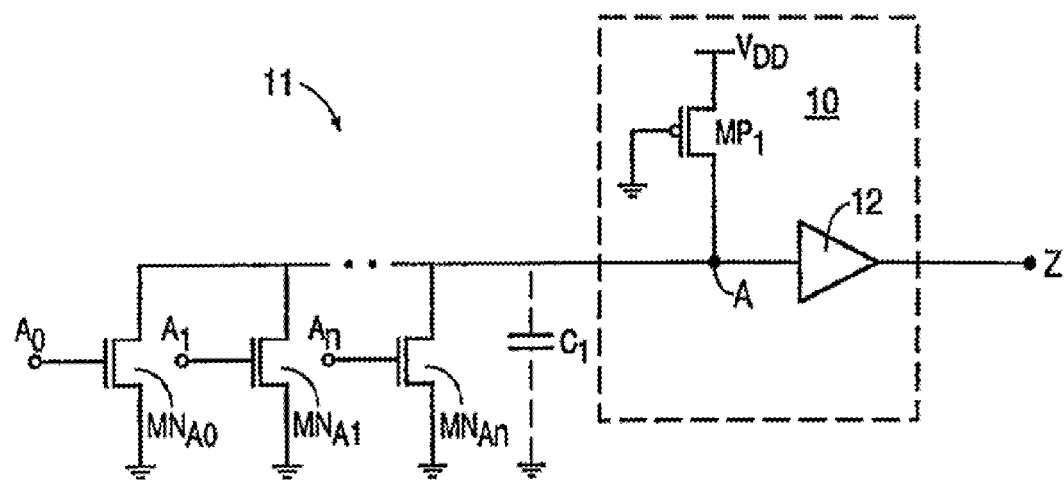
Figure 2:
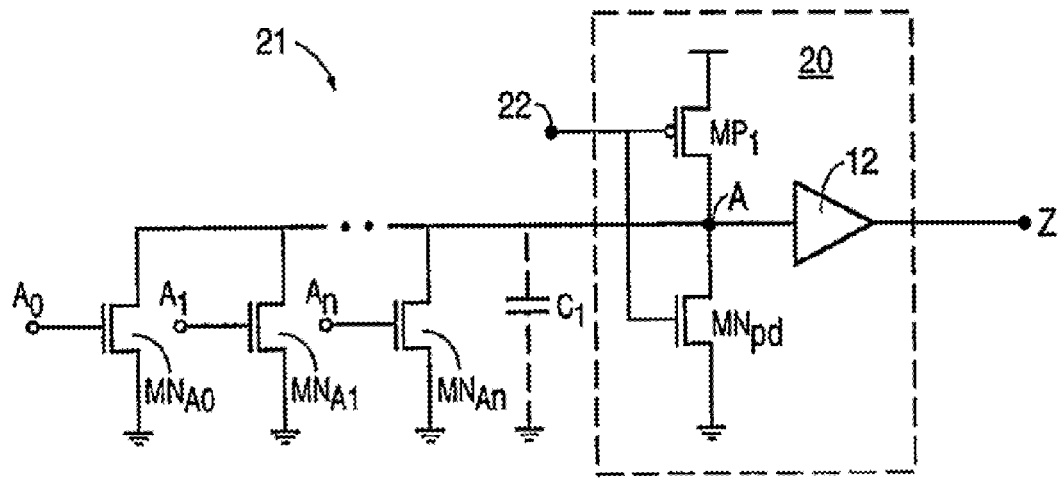

FIG. 2 shows a CMOS buffer circuit 20 in accordance with the present invention. Buffer circuit 20 operates in a manner similar to prior art buffer circuit 10 of FIG. 1 and, accordingly, those components common to buffer circuit 20 and buffer circuit 10 are similarly labelled. It is to be noted that circuit 20 is shown as part of and described in conjunction with an OR gate 21 for simplicity only. Aspects of the present invention which are described below are equally applicable for use with other frontal logic functions.

Buffer circuit 20 includes a test node 22 coupled to the gate of a P-channel pull-up MOS transistor $MP_1$ and to the gate of an N-channel pull-down MOS transistor $MN_{pd}$. The drain of transistor $MN_{pd}$ is connected to the drain of transistor $MP_1$ at input node A, and the source of transistor $MN_{pd}$ is connected to ground potential. During normal operation of buffer circuit 20, a logic low test signal is provided to test node 22. In this state, where transistor $MP_1$ is conducting and transistor $MN_{pd}$ is non-conducting, circuit 20 is equivalent to and operates in a manner identical to circuit 10 (FIG. 1).

During test mode, where it is desired to perform $I_{DDQ}$ testing upon either circuit 20 or the IC in which circuit 20 is contained, a logic high test signal is provided to test node 22. This logic high signal simultaneously turns off pull-up transistor $MP_1$ and turns on pull-down transistor $MN_{pd}$, thereby opening the path between node A and $V_{DD}$ while shorting node A to ground potential. As long as the gate of transistor $MP_1$ is held high, DC current will not flow through circuit 20 via transistor $MP_1$. Shorting node A to ground potential via pull-down transistor $MN_{pd}$ prevents node A from floating to a voltage that would cause the P-channel and N-channel transistors (not shown) within CMOS inverter 12 to simultaneously conduct and, thus, ensures that no DC crossover current flows in CMOS inverter 12. In such a test mode, an $I_{DDQ}$ reliability test may be readily and accurately performed. Any quiescent current $I_{DDQ}$ flowing in circuit 20, or in its host IC, resulting from small manufacturing defects will not be obscured larger DC currents flowing through circuit 20 and, as a result, may be readily detected.

It is to be understood that the polarities of the above-described pull-up and pull-down transistors may be reverse while still realizing the advantages of the present invention. Further, it is to be noted that the present invention is not limited to the specific buffer circuit 20 (FIG. 2) but rather may be used to facilitate $I_{DDQ}$ testing of any circuit which employs a such a pull-up/pull-down configuration.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A buffer circuit comprising:

an input node;

at least one transistor having a control terminal coupled to receive an associated input signal, a first current-handling terminal coupled to a first reference voltage, and a second current-handling terminal coupled to said input node;

a test terminal for receiving a test signal;

a pull-up transistor having a first current-handling terminal coupled to a second reference voltage, a second-current handling terminal coupled to said input node, and a control terminal coupled to said test terminal; and a pull-down transistor having a first current-handling terminal coupled to said first reference voltage, a second-current handling terminal coupled to said input node, and a control terminal coupled to said test terminal, wherein no DC current flows through said circuit when said test signal is in a first logic state.

2. The structure of claim 1 wherein said pull-up transistor comprises a P-channel MOS device and said pull-down device comprises an N-channel MOS device.

3. The structure of claim 2 wherein said first logic state is high.

4. The structure of claim 1 wherein said pull-up transistor comprises an N-channel MOS device and said pull-down transistor comprises a P-channel MOS device.

5. The structure of claim 4 further wherein said first logic state is low.

\* \* \* \* \*

UNITED STATES PATENT AND TRADEMARK OFFICE
CERTIFICATE OF CORRECTION

PATENT NO. : 5,570,036
APPLICATION NO. : 08/519444
DATED : October 29, 1996
INVENTOR(S) : Robert K. Montoye and John J. Zasio It is certified that error appears in the above-identified patent and that said Letters Patent is hereby corrected as shown below:

In the Drawings, replace Sheet 1 with Replacement Sheet 1.

Signed and Sealed this

Thirty-first Day of July, 2007

JON W. DUDAS
*Director of the United States Patent and Trademark Office*